(12) United States Patent
Hasegawa (10) Patent No.: US 7,098,467 B2
(45) Date of Patent: Aug. 29, 2006

(54) MEASURING METHOD AND APPARATUS, EXPOSURE METHOD AND APPARATUS, AND DEVICE MANUFACTURING METHOD

(75) Inventor: Takayuki Hasegawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 148 days.

(21) Appl. No.: 10/994,326

(22) Filed: Nov. 23, 2004

(65) Prior Publication Data

US 2005/0116184 A1 Jun. 2, 2005

(30) Foreign Application Priority Data

Nov. 28, 2003 (JP) ............................. 2003-399487

(51) Int. Cl.
*A61N 5/00* (2006.01)
*G21G 5/00* (2006.01)
*G01B 9/00* (2006.01)
*G01N 21/00* (2006.01)

(52) U.S. Cl. ............................... 250/492.2; 356/239.2; 356/124

(58) Field of Classification Search ............. 250/492.2; 356/124, 239.2
See application file for complete search history.

(56) References Cited

U.S. PATENT DOCUMENTS

| 5,317,615 | A |   | 5/1994 | Ebinuma et al. ............... 378/34 |
| 5,467,637 | A |   | 11/1995 | Hasegawa et al. ......... 73/24.01 |
| 5,828,572 | A |   | 10/1998 | Hasegawa et al. ..... 364/468.24 |
| 5,835,217 | A | * | 11/1998 | Medecki ..................... 356/521 |
| 5,976,737 | A |   | 11/1999 | Oka ............................. 430/22 |
| 6,078,640 | A |   | 6/2000 | Hasegawa et al. ............. 378/34 |
| 6,081,581 | A |   | 6/2000 | Hasegawa .................... 378/145 |
| 6,097,790 | A |   | 8/2000 | Hasegawa et al. .......... 378/161 |
| 6,144,719 | A |   | 11/2000 | Hasegawa et al. ............. 378/34 |
| 6,573,997 | B1 | * | 6/2003 | Goldberg et al. ............ 356/521 |
| 6,618,146 | B1 |   | 9/2003 | Hasegawa .................... 356/400 |

FOREIGN PATENT DOCUMENTS

| JP | 9-98589 | 4/1997 |
| WO | WO 03/102529 A1 | 12/2003 |

OTHER PUBLICATIONS

Naulleau et al., Characterization of the accuracy of EUV phase-shifting point diffraction interferomery, Feb. 23, 1998, SPIE vol. 3331, pp. 114-123.*

European Search Report dated Jan. 14, 2005, issued in corresponding European patent appln. no. 04 02 8147, forwarded in a Communication dated Jan. 27, 2005.

Goldberg, K., et al "Extreme ultraviolet alignment and testing of a four-mirror ring field extreme ultraviolet optical system," J. Vac. Sci. Technol. B, vol. 18, No. 6, Nov. 2000. pp. 2911-2915.

(Continued)

*Primary Examiner*—Jack Berman
*Assistant Examiner*—Jennifer Yantorno
(74) *Attorney, Agent, or Firm*—Fitzpatrick, Cella, Harper & Scinto (57) ABSTRACT

A measuring apparatus for irradiating measuring light and for measuring optical performance of a target optical system includes a barrel for housing the target optical system, the barrel being rotatable around an optical axis of the target optical system, and an illumination optical system for introducing the measuring light into the barrel, the illumination optical system being movable along a direction perpendicular to the optical axis of the target optical system, wherein the measuring apparatus controls an illumination area of the measuring light in the target optical system using a polar coordinate determined by a rotational angle of the barrel and a moving amount of the illumination optical system.

11 Claims, 8 Drawing Sheets

OTHER PUBLICATIONS

Goldberg, K., et al "EUV Interferometry of a Four-Mirror Ring-Field EUV Optical System," *Proceedings of the SPIE —The International Society for Optical Engineering SPIE*, vol. 3997, 2000. pp. 867-873.

Naulleau, P.P., et al. "Static Microfield Printing at the Advanced Light Source with the ETS Set-2 Optic," *Proceedings of the SPIE—The International Society for Optical Engineering SPIE*, vol. 4688, 2002. pp. 64-71.

Naulleau, P.P., et al. "Adding static printing capabilities to the EUV phase-shifting point diffraction Interferometer," *Proceedings of the SPIE—The International Society for Optical Engineering SPIE*, vol. 4343, 2001. pp. 639-645.

Medecki, H., et al. "Phase-shifting point diffraction interferometer," Optics Letters, Optical Society of America, vol. 21, No. 19, Oct. 1996. pp. 1526-1528.

* cited by examiner

MEASURING METHOD AND APPARATUS, EXPOSURE METHOD AND APPARATUS, AND DEVICE MANUFACTURING METHOD

BACKGROUND OF THE INVENTION

The present invention relates generally to a method and apparatus for measuring performance of an optical element, and more particularly to a measuring method and apparatus for measuring a wave front of a projection optical system that transfers a pattern on a mask onto an object, etc. The present invention also relates to an exposure method and apparatus suing such a measuring method and apparatus. The inventive measuring method and apparatus are suitable, for example, for measurements that use as measuring light synchrotron radiation, such as a synchrotron ring, an undulator, etc.

A projection exposure apparatus is used to transfer a pattern on a mask (or a reticle) onto an object to be exposed in manufacturing semiconductor devices, etc. in the lithography process. This exposure apparatus is required to transfer the pattern on the reticle onto the object precisely at a predetermined magnification. For this purpose, it is important to use a projection optical system having good imaging performance and reduced aberration. In particular, due to the recent demands for finer processing of semiconductor devices, a transfered pattern is sensitive to the aberration of the optical system. Therefore, there is a demand to measure the wave front aberration of the projection optical system with high precision.

Figure 6:
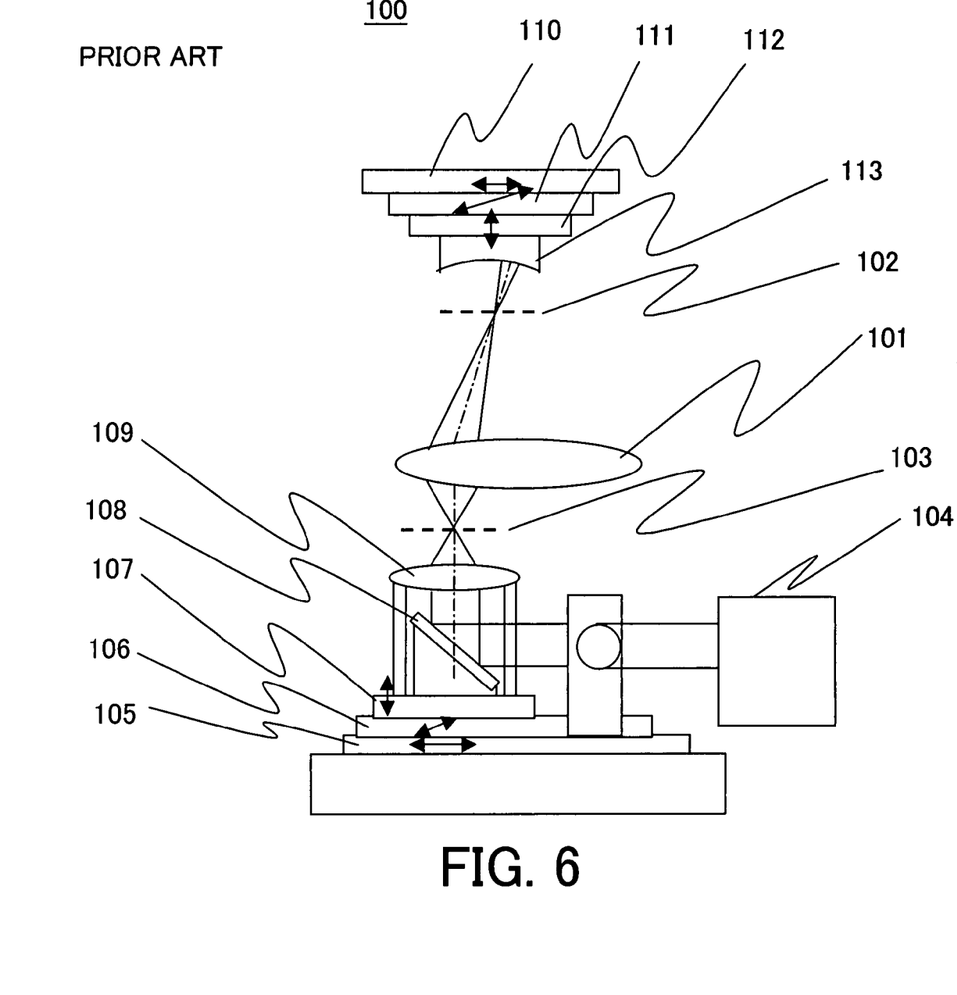
FIG. 6 is an optical-path diagram for explaining a structure of a conventional optical performance measuring apparatus.

FIG. 6 shows an optical path of a conventional lens performance measuring apparatus 100. In FIG. 6, 101 denotes a target optical element or optical system, such as a projection optical system. 102 denotes an object surface of the target lens 101. 103 denotes an image surface. 109 denotes a condenser lens, which has a final surface as a reference surface for reflecting part of incident light. 108 denotes a mirror for deflecting the measuring light. 105, 106 and 107 denote stages that are mounted with the condenser lens 109 and the mirror 108 and move in X, Y and Z directions, respectively. 113 denotes a spherical mirror, and its center of the radius of curvature approximately accords with the object surface 102. 110, 111 and 112 denote stages that are mounted with the spherical mirror 113 and move in X, Y and Z directions, respectively. 104 denotes an interferometer body, which houses a laser light source (not shown), a lens (not shown), a collimetor lens (not shown), a beam splitter (not shown), an interferometer condenser lens (not shown), a camera (not shown), etc.

According to the above structure, a collimated ray emitted from the interferometer body 104 is reflected on the spherical mirror 109's final surface and incident as interference light upon the interferometer body 104, forming interference fringes on the camera (not shown). The wave front aberration of the target optical system 101 is calculated from the obtained interference fringes. In order to measure plural positions on the image surface 103 of the target optical system 101, the stages 105, 106 and 107 that install the condenser lens 109 may move to a predetermined position, and the stages 111, 112 and 113 that install the spherical mirror 113 may move to a corresponding position. Such an apparatus is disclosed, for example, in Japanese Patent Application, Publication No. 9-98589.

The conventional measuring apparatus that uses the ultraviolet ("UV") light as measuring light can easily reflect the light using a mirror and thus easily measure plural positions on the image surface 103. On the other hand, due to the demand for the fine processing of the semiconductor device, the practical implementation of a reduction projection exposure apparatus that utilizes the extreme ultraviolet (EUV) light having a wavelength between 10 and 15 nm, shorter than the UV light is now promoted. It is conceivable that an interference measurement of an EUV optical system utilizes an intensifier EUV light source, such as an undulator light source inserted into an electron accumulation ring. Since the electron accumulation ring should maintain the inside ultra high vacuum ("UHV"), the optical element is provided in the UHV and free orthogonal driving of the stages 105 to 107 shown in FIG. 6 becomes difficult. In particular, it becomes difficult to displace the measuring light in a direction perpendicular to the optical-axis direction. As a result, it becomes difficult to measure plural positions on the image surface, or a necessary area of the target optical system.

BRIEF SUMMARY OF THE INVENTION

Accordingly, it is an illustrative object of the present invention to provide a measuring method and apparatus for measuring the optical performance, such as a wave front, in a necessary area of the target optical system while the measuring method and apparatus are compatible with an undulator light source etc. as a measuring light source, an exposure method and apparatus using them, and a device manufacturing method.

A measuring apparatus according to one aspect of the present invention for irradiating measuring light and for measuring optical performance of a target optical system includes a barrel for housing the target optical system, the barrel being rotatable around an optical axis of the target optical system, and an illumination optical system for introducing the measuring light into the barrel, the illumination optical system being movable along a direction perpendicular to the optical axis of the target optical system, wherein the measuring apparatus controls an illumination area of the measuring light in the target optical system using a polar coordinate determined by a rotational angle of the barrel and a moving amount of the illumination optical system.

The measuring light may be a synchrotron radiation from an electron accumulation ring or an undulator inserted into the electron accumulation ring. The measuring apparatus may further include at least two alignment marks fixed onto the barrel, a detector, fixed outside the barrel, for detecting the alignment mark, and an operation part for calculating an offset amount between a rotational axis of the barrel and the optical axis of the target optical system, based on a detection result by the detector. The measuring apparatus may further include a controller for controlling driving of the mirror barrel based on the offset amount.

A measuring method according to another aspect of the present invention includes the steps of setting, on a polar coordinate, an illumination area of measuring light on a target optical system housed in a barrel, and measuring optical performance of the target optical system by irradiating the measuring light onto the target optical system.

An exposure method according to still another aspect of the present invention includes the steps of calculating a wave front aberration of a target optical system using the above measuring method, adjusting the target optical system based on the calculated wave front aberration of the target optical system, and exposing an object using the adjusted target optical system.

An exposure apparatus according to another aspect of the present invention for exposing a pattern formed on a mask onto an object using light includes a projection optical system for projecting the pattern onto the object, and the above measuring apparatus for detecting a wave front aberration of the projection optical system as an interference fringe. The exposure light may be the EUV light having a wavelength of 20 nm or smaller.

A device manufacturing method according to still another aspect of the present invention includes the steps of exposing an object using the above exposure apparatus, and developing the object exposed.

Other objects and further features of the present invention will become readily apparent from the following description of the preferred embodiments with reference to accompanying drawings.

DETAILED DESCRIPTION OF THE PREFERRED EMBODIMENTS

Figures 1A, 1B:
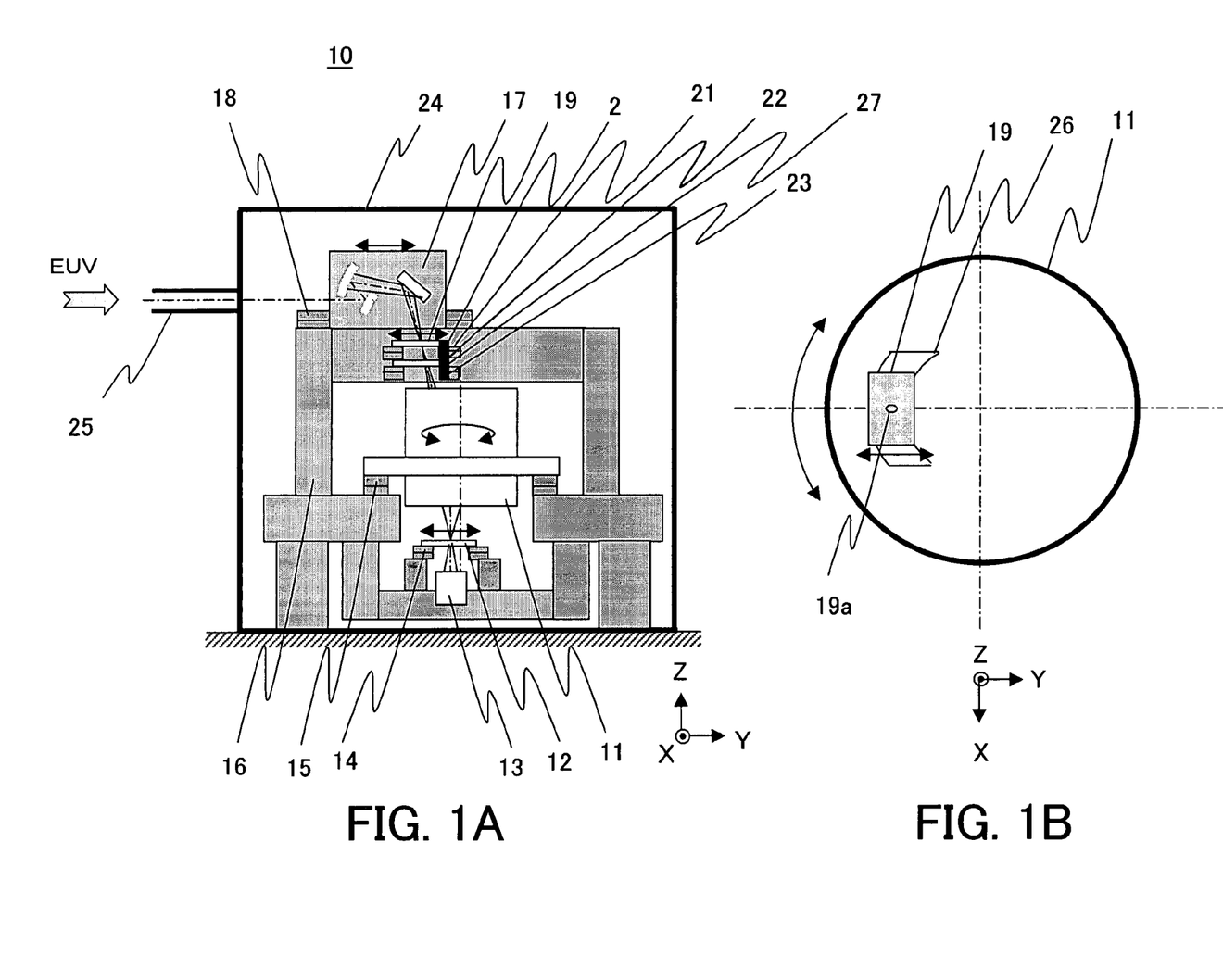
FIGS. 1A and 1B are sectional and plane views showing an optical path in an exposure apparatus that includes a measuring apparatus according to one embodiment of the present invention.
Figure 2:
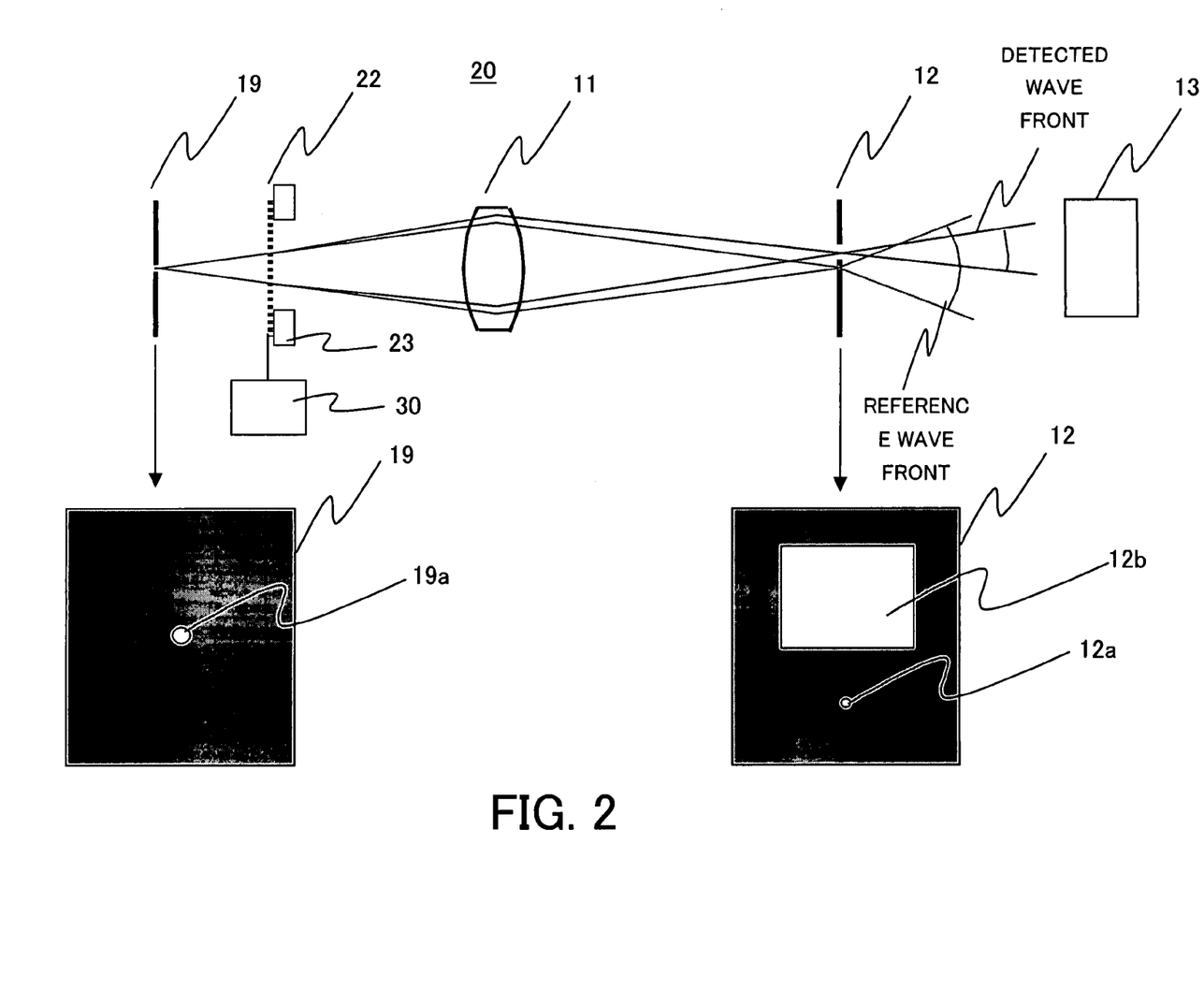
FIG. 2 is an optical-path diagram showing an illustrative measuring principle of the measurement apparatus shown in FIG. 1.

Referring to FIGS. 1 to 3, a description will now be given of an EUV exposure apparatus 10 having a measuring apparatus 20 according to one embodiment of the present invention. Here, FIG. 1A is a sectional view of the principal part of the EUV exposure apparatus 10. FIG. 2 is a schematic optical-path diagram showing the principal part of the measurement apparatus 20. The measuring apparatus 20 measures a wave front of the projection optical system housed in a barrel 11 of the EUV exposure apparatus 10 using the EUV light from an undulator (not shown) as a light source. While the measuring apparatus 20 of the instant embodiment uses point diffraction interferometry ("PDI") as an interferometry, the measuring apparatus 20 may use the lateral shearing interferometry ("LSI") and the line diffraction interferometry ("LDI") and other interferometries.

In FIG. 1A, 11 denotes a barrel for the projection optical system as a target optical system. 12 denotes a wafer-side mask that has a pinhole 12a and a window 12b. The wafer-side mask 12 is provided near the image surface of the barrel 11. 13 denotes a CCD camera that measures interference fringes. 14 denotes a wafer-side mask stage that supports the wafer-side mask 12 and moves it in the Y direction. 19 denotes a reticle-side mask having a pinhole 19a. 21 denotes a reticle-side mask stage that supports a reticle-side mask 19 and moves it in the Y direction. 22 denotes a grating. 23 denotes a grating stage that supports the grating 22 and moves it in the Y direction. 30 denotes phase shift means for driving the grating stage 23 so as to shift a phase of a wave front. 17 denotes an illumination optical system for illuminating the pinhole 19a in the reticle-side mask 19. 18 is an illumination system stage that supports the illumination optical system 17 and moves it in the Y direction. 16 denotes a structure that supports the barrel 11 and various stages, such as a θz stage 15. 24 denotes a vacuum chamber that maintains the entire interferometer to be vacuum. 25 denotes a beam line for introducing the EUV light from the undulator (not shown). 27 denotes alignment-mark detecting means for detecting an alignment mark used to align the field of the barrel 11 with a measured position. The alignment-mark detecting means 27 is fixed onto the reticle-side mask stage 21. FIG. 1B is a plane view of the barrel 11 viewed from the top of the barrel 11. 26 denotes an exposure field in the barrel.

Referring now to FIG. 2, a description will be given of the measurement procedure. The illumination optical system 7 introduces the EUV light from the undulator (not shown) into the pinhole 19a in the reticle-side mask 19 at a predetermined NA. The EUV light emitted from the pinhole 19a becomes a spherical wave, is split into two rays by the grating 22, and enters the barrel 11. These two rays enter the pinhole 12a and the window 12b in the wafer-side mask 12. The light incident upon the pinhole 12a becomes a spherical wave. The light incident upon the window 12b passes through the window 12b while maintaining the wave front information of the barrel 11. The interference light between these two rays enters the CCD camera 13, and forms interfere fringes on the image pickup surface. Thus, one point in the field 26 in the barrel 11 can be measured.

Figure 3A:
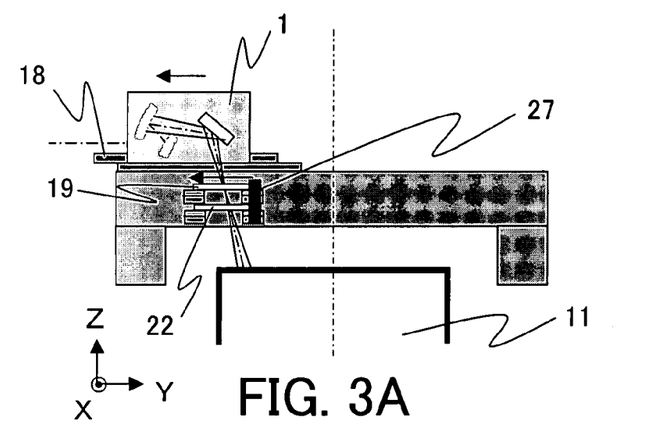
FIGS. 3A, 3B and 3C are sectional and plane views for explaining how the measuring apparatus shown in FIG. 1 sets a measurement area.
Figure 3B:
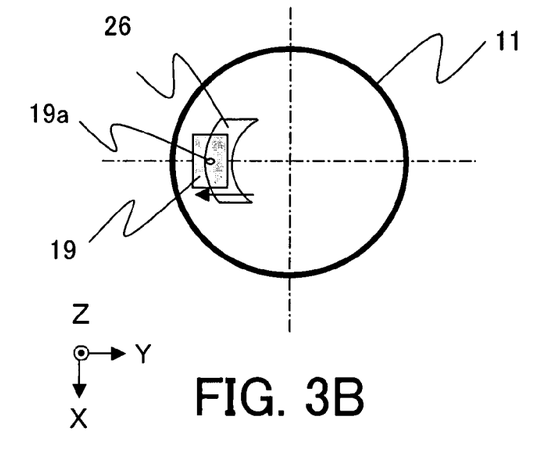
Figure 3C:
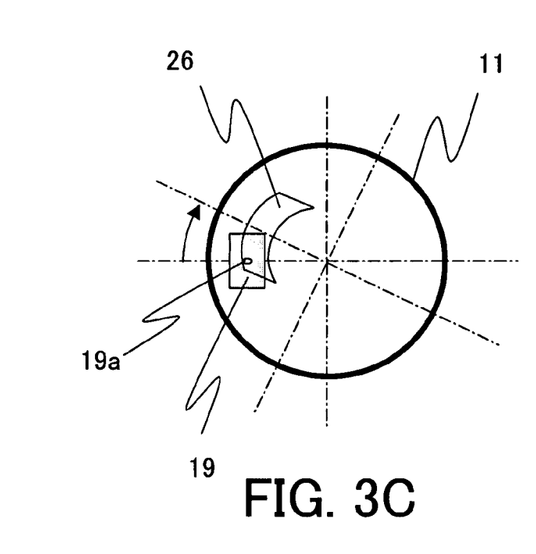

Referring to FIG. 3, a description will be given of measurements of plural points in the field 26. Here, FIG. 3A is a partial sectional view for showing how the measuring apparatus 20 controls the illumination area of the measuring light in the target optical system. FIG. 3B is a plane view of the barrel 11 viewed from the top of the barrel 11, showing changes of the irradiated area (or the field 26) as the illumination optical system 17 moves. FIG. 3C is a plane view of the barrel 11 viewed from the top of the barrel 11, showing changes of the field 26 as the barrel 11 rotates.

It is understood from FIG. 3B that as the illumination optical system stage 18 moves the illumination optical system 17 in the Y direction, a measurement position (or a spot of the illumination light) of the field 26 moves in the Y direction. Depending upon this amount, the reticle-side mask stage 19 and the grating stage 23 move in the Y direction. The wafer-side mask stage 14 moves in the Y direction by an amount of the reticle-side stage 19 times the magnification of the barrel 11. Thus, plural points in the field 26 can be measured in the Y direction. When the synchrotron radiation is used, a position in the radiation direction (or Y direction) is relatively easily changeable by moving the entire illumination system in the Y direction without an additional mirror. On the other hand, it is understood from FIG. 3C that as the θz stage 15 rotates the barrel 11, a measurement position of the field (or a spot of the illumination light) rotates. Driving of this polar coordinate system provides measurements of the entire surface of the field 26. While the field 26 has an arc shape around the optical axis, it may have a rectangular shape.

Figure 4A:
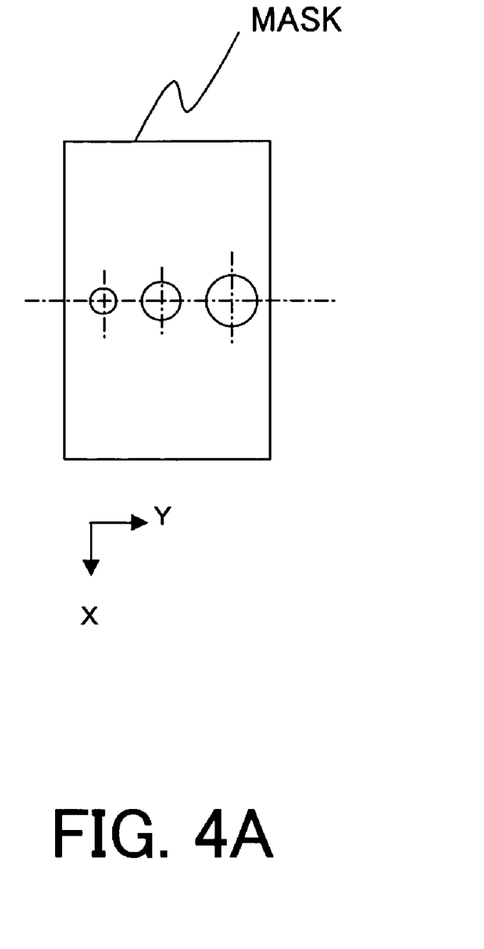
FIGS. 4A and 4B are plane views of a mask having plural pinholes of this embodiment.
Figure 4B:
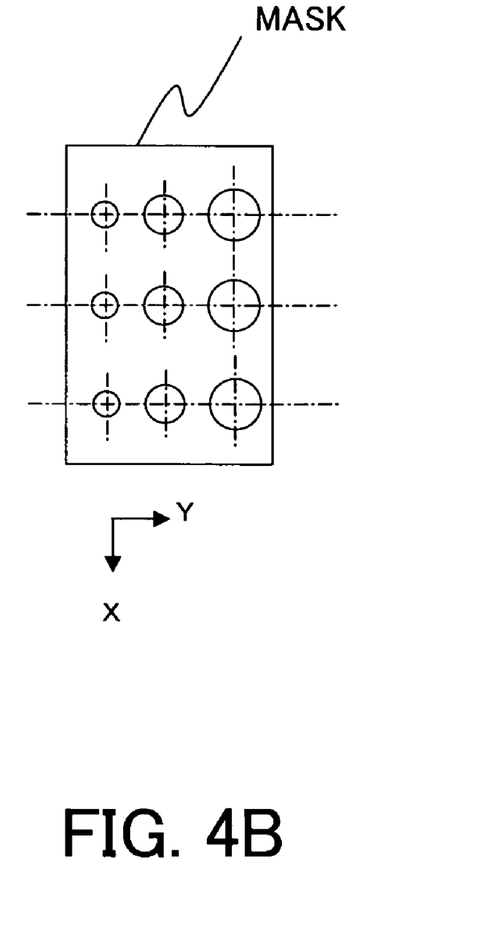

As discussed, by combining the Y stage of the illumination optical system 17 with the θz stage 15 of the barrel 11, the wave front measuring apparatus that uses the EUV light from the undulator as a light source easily measures an arbitrary position on the entire surface in the barrel 11's field 26. One pinhole 19a in the mask 19 for measuring the entire surface in the field 26 would be less expensive than plural types of masks 19. Alternatively, the mask 19 may have plural pinholes having different shapes as shown in FIG. 4A, or a preliminary pinhole as shown in FIG. 4B. FIG. 4A arranges differently sized pinholes in the Y direction. FIG. 4B provides a preliminary pinhole in the X direction, although FIG. 4B requires an addition of an X-axis stage to the mask stage.

Figure 5A:
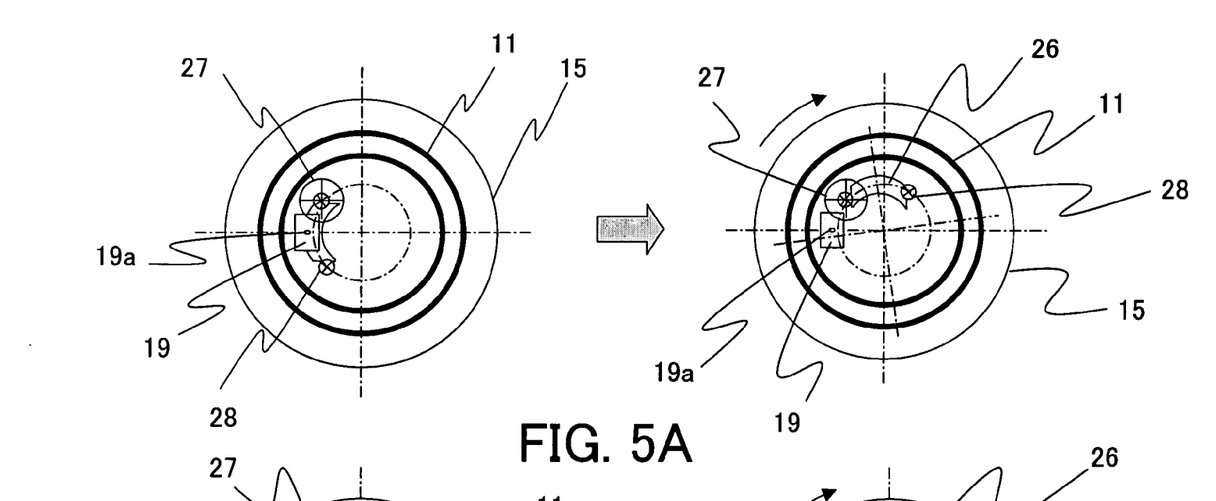
FIGS. 5A and 5B are plane views for explaining an alignment by the measuring apparatus shown in FIG. 1.
Figure 5B:
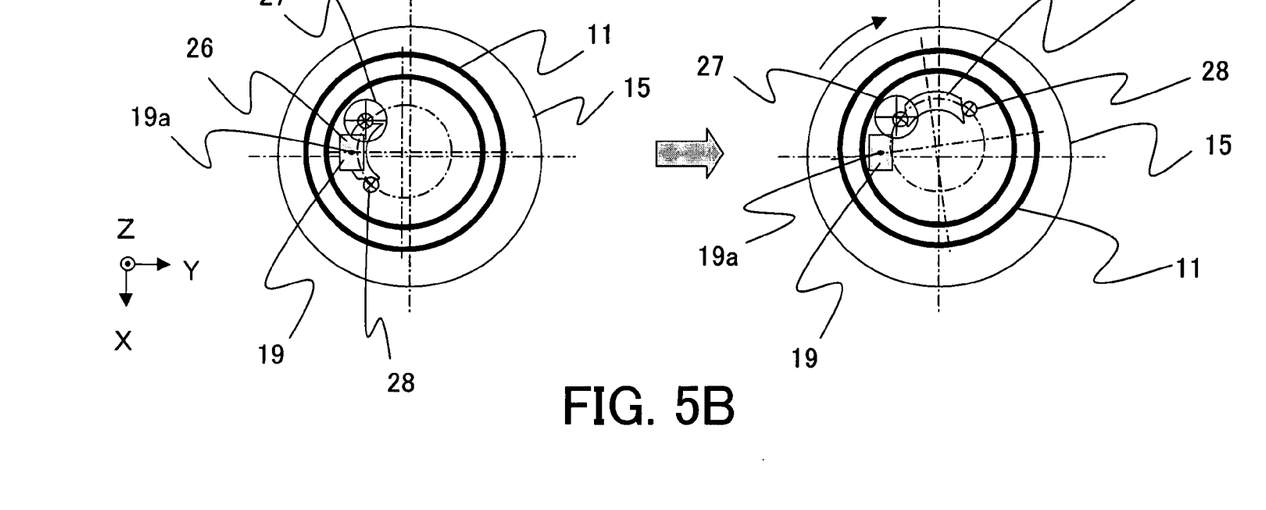

Referring now to FIG. 5, a description will be given of an alignment between the field 26 of the barrel 11 and the reticle-side pinhole 19a and a correction of an offset error between the rotational center of the θz stage 15 and the optical axis. In FIG. 5, 28 denotes alignment marks, fixed onto the barrel 11, for indicating a center of the field 26. In order to detect an offset of the rotational center when the barrel 11 rotates by an angle θz, at least two alignment marks are arranged an equal distance apart from the optical-axis center. 27 denotes alignment mark detector means fixed onto the reticle-side mask stage 21. A positional relationship between the alignment mark detector means 27 and the reticle-side pinhole 19a has been previously measured as discussed above.

FIG. 5A shows a state where the barrel 11 is driven by the angle θz (see the right side in FIG. 5A) from a state where the optical axis of the barrel 11 accords with the rotational center of the θz stage 15 (see the left side in FIG. 5A). As shown in FIG. 5A, as the barrel 11 rotates by the angle θz, the second alignment mark 28 moves to a position just below the alignment mark detector means 27. On the other hand, FIG. 5B shows an offset between the optical axis of the barrel 11 and the rotational center of the θz stage 15.

First, positions of the θz stage 15 and the reticle-side mask stage 21 are adjusted so that one of the alignment marks 28 moves to a position just below the alignment mark detector means 27. When the θz stage 15 is rotated in this state, the barrel 11 rotates eccentrically because of the offset between these centers. As shown in FIG. 5B, a position of the second alignment mark offsets from the center of the alignment mark detector means 27. This offset amount $\Delta B=(\delta x, \delta y)$ is measured by driving the alignment mark 28 moves to a position just below the alignment mark detector means 27. An offset of the rotational center at the setting time $\Delta A=(\Delta X, \Delta Y)$ is calculated using the following equations and obtained $\Delta B$, where R is a matrix of rotation, "A" is a coordinate of the first alignment mark, and "B" is a coordinate of the second alignment mark. The capital indicates a matrix:

$$B = R \times A \quad (1)$$

$$B' = R \times (A + \Delta A) \quad (2)$$

$$\Delta B = B' - B \quad (3)$$

$$\Delta A = R^{-1} \times \Delta B \quad (4)$$

Based on obtained values (ΔX, ΔY), driving amounts of the stage are corrected to measure predetermined positions in the field.

Thus, an arbitrary position in the field can be precisely measured by providing two alignment marks in the barrel, measuring an offset between the center of the barrel and the rotational center of the θz stage, and correcting the driving amount of the stage.

As discussed, according to the instant embodiment, even when the electron ring etc. are used as a light source, the entire surface of the field of the target optical system can be easily measured. Since the alignment of the target optical system is conducted by at least two points, an offset between the optical axis of the target optical system and the center of the driving means around the optical axis can be calculated, providing a more precise field alignment for the target optical system by correcting stage's driving based on the calculated offset amount.

The exposure apparatus 10 includes an illumination apparatus (not shown) different from the measuring apparatus has a mask, on which a circuit pattern of a semiconductor device (such as a semiconductor chip, e.g., an IC and an LSI, a liquid crystal panel and a CCD) is formed, and a plate, and uses the EUV light to expose a circuit pattern on the mark onto the plate, for example, by a step-and-scan manner or step-and-repeat manner. A laser plasma light source that is known in the art may be used as a EUV light source rather than the measuring electron accumulation ring. Of course, the inventive exposure apparatus is not limited to one that uses the EUV light. This embodiment can easily add an aberration measuring function to the projection exposure apparatus by using a reflection mask pattern.

A description will now be given of an aberration correction method according to one embodiment of the present invention. The exposure apparatus 10 allows plural optical elements (not shown) in the projection optical system to move in the optical-axis direction and/or a direction orthogonal to the optical-axis direction. By driving one or more optical elements using the driving system (not shown) for aberrational adjustments based on aberrational information obtained from the instant embodiment, it is possible to correct or optimize one or more aberrations of the projection optical system, in particular Seidel's classification of aberrations. The means for adjusting the aberration of the projection optical system can use various known system, such as a movable lens, a movable mirror (when the projection optical system is a catadioptric optical system or full-mirror optical system), an inclinable parallel plate, a pressure-controllable space, and a surface correction using an actuator.

Figure 7:
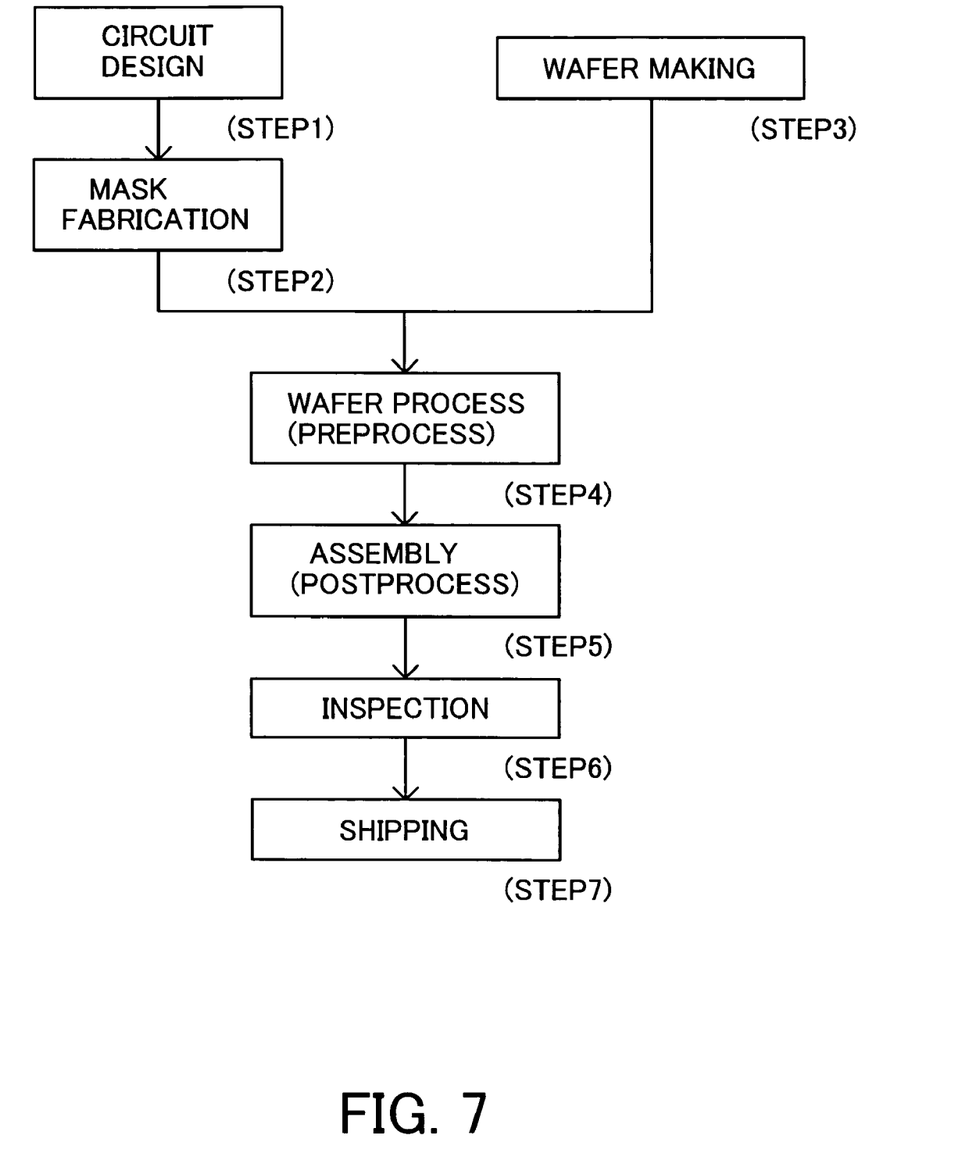
FIG. 7 is a flowchart for explaining a method for fabricating devices (semiconductor chips such as ICs, LSIs, and the like, LCDs, CCDs, etc.).

A description will now be given of an embodiment of a device manufacturing method using the exposure apparatus 10. FIG. 7 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 8:
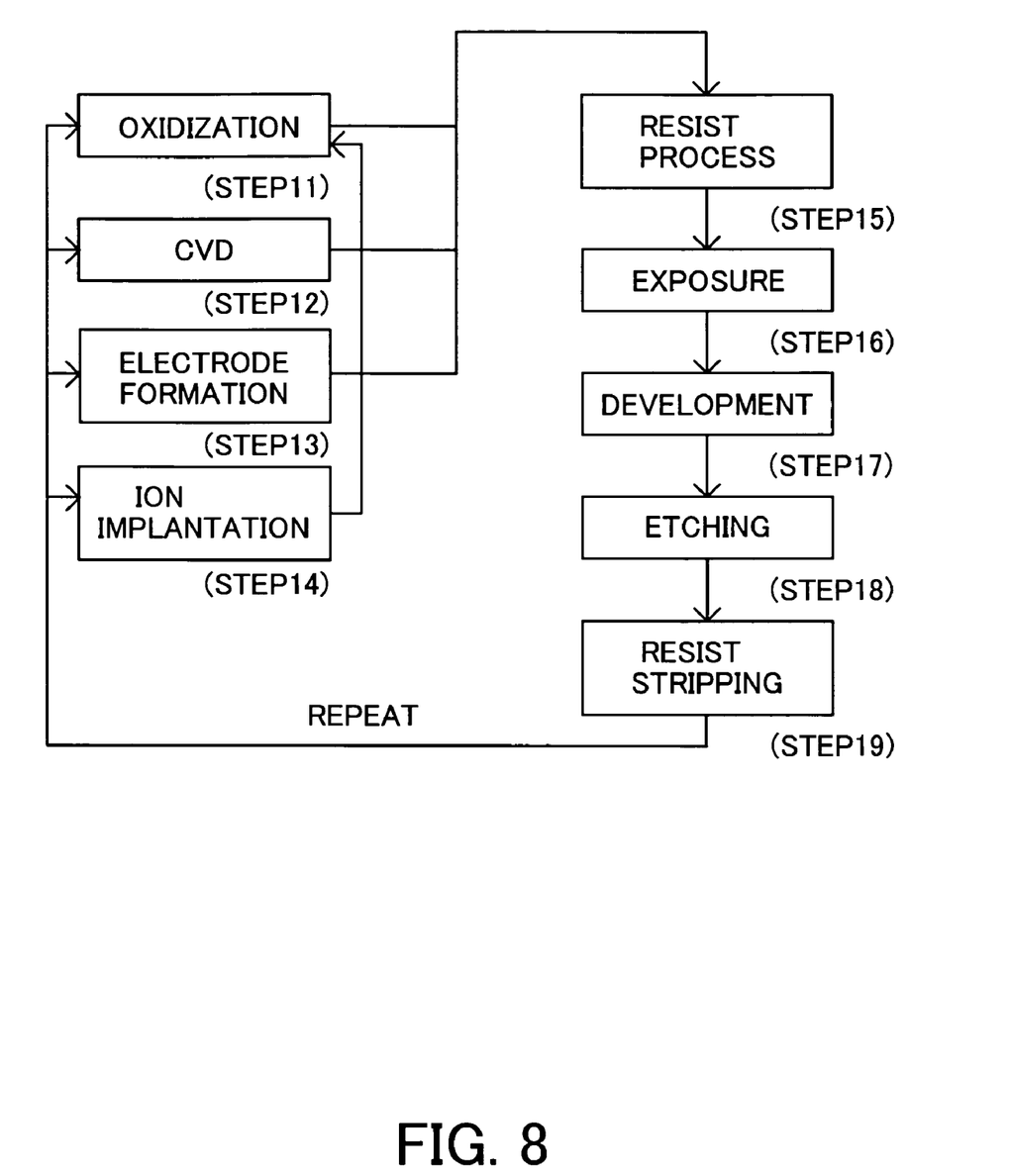
FIG. 8 is a detailed flowchart for Step 4 of wafer process shown in FIG. 7.

FIG. 8 is a detailed flowchart of the wafer process in Step 4 shown in FIG. 7. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The manufacturing method of the present invention can manufacture semiconductor devices which have been difficult to manufacture, because the wave front aberration has been corrected with high precision.

The present invention thus uses a polar coordinate system rather than a Cartesian coordinate system, and provide a measuring method and apparatus for measuring the optical performance, such as a wave front, in a necessary area of the target optical system while the measuring method and apparatus are compatible with an undulator light source etc. as a measuring light source, an exposure method and apparatus using them, and a device manufacturing method This application claims a foreign priority based on Japanese Patent Application No. 2003-399487, filed Nov. 28, 2003, which is hereby incorporated by reference herein.

What is claimed is:

1. A measuring apparatus for irradiating measuring light and for measuring optical performance of a target optical system, said measuring apparatus comprising:
    a barrel for housing the target optical system, said barrel being rotatable around an optical axis of the target optical system; and
    an illumination optical system for introducing the measuring light into said barrel, said illumination optical system being movable along a direction perpendicular to the optical axis of the target optical system,
    wherein said measuring apparatus controls an illumination area of the measuring light in the target optical system using a polar coordinate determined by a rotational angle of said barrel and a moving amount of said illumination optical system.

2. A measuring apparatus according to claim 1, wherein the measuring light is synchrotron radiation from an electron accumulation ring or an undulator inserted into the electron accumulation ring.

3. A measuring apparatus according to claim 1, further comprising:
    at least two alignment marks fixed onto said barrel;
    a detector, fixed outside said barrel, for detecting the alignment mark; and
    an operation part for calculating an offset amount between a rotational axis of said barrel and the optical axis of the target optical system, based on a detection result by said detector.

4. A measuring apparatus according to claim 3, further comprising a controller for controlling a driving of the mirror barrel based on the offset amount.

5. A measuring method comprising the steps of:
    setting, on a polar coordinate, an illumination area of measuring light in a target optical system housed in a barrel, the barrel being rotatable around an optical axis of the target optical system; and
    measuring optical performance of an arbitrary position of the target optical system by rotating the barrel and irradiating the measuring light onto the target optical system.

6. A measuring method according to claim 5, wherein said measuring step includes a step of moving the illumination area along a direction perpendicular to the optical axis of the target optical system.

7. An exposure method comprising the steps of:
    calculating a wave front aberration of a target optical system using a measuring method that includes the steps of setting, on a polar coordinate, an illumination area of measuring light in the target optical system housed in a barrel, the barrel being rotatable around an optical axis of the target optical system, and measuring optical performance of an arbitrary position of the target optical system by rotating the barrel and irradiating the measuring light onto the target optical system;
    adjusting the target optical system based on the calculated wave front aberration of the target optical system; and
    exposing an object using the adjusted target optical system.

8. An exposure method according to claim 7, wherein said measuring step includes a step of moving the illumination area along a direction perpendicular to the optical axis of the target optical system.

9. An exposure apparatus for exposing a pattern fanned on a mask onto an object using light, said exposure apparatus comprising:
    a projection optical system for projecting the pattern onto the object; and
    a measuring apparatus for detecting a wave front aberration of said projection optical system as an interference fringe, wherein said measuring apparatus includes:
    a barrel for housing said projection optical system, said barrel being rotatable around an optical axis of said projection optical system; and
    an illumination optical system for introducing the measuring light into said barrel, said illumination optical system being movable along a direction perpendicular to the optical axis of said projection optical system, wherein said measuring apparatus controls an illumination area of the measuring light on said projection optical system using a polar coordinate determined by a rotational angle of said barrel and a moving amount of said illumination optical system.

10. An exposure apparatus according to claim 9, wherein the exposure light is an extreme ultraviolet light having a wavelength of 20 nm or smaller.

11. A device manufacturing method comprising the steps of:
    exposing an object using an exposure apparatus that includes a projection optical system for projecting the pattern onto the object, and a measuring apparatus for detecting a wave front aberration of said projection optical system as an interference fringe, wherein said measuring apparatus includes, a barrel for housing said projection optical system, said barrel being rotatable around an optical axis of said projection optical system, and an illumination optical system for introducing the measuring light into said barrel, said illumination optical system being movable along a direction perpendicular to the optical axis of said projection optical system, wherein said measuring apparatus controls an illumination area of the measuring light in said projection optical system using a polar coordinate determined by a rotational angle of said barrel and a moving amount of said illumination optical system; and
    developing the object exposed.

* * * * *

UNITED STATES PATENT AND TRADEMARK OFFICE
CERTIFICATE OF CORRECTION

PATENT NO. : 7,098,467 B2  Page 1 of 1
APPLICATION NO. : 10/994326
DATED : August 29, 2006
INVENTOR(S) : Takayuki Hasegawa It is certified that error appears in the above-identified patent and that said Letters Patent is hereby corrected as shown below:

IN THE DRAWINGS:
  Sheet 2 of 8, "FIG. 2," in the right-hand side, in the middle, "REFERENC E WAVE" should read -- REFERENCE WAVE --.

COLUMN 5:
  Line 42, "moves" should read -- to move --.

COLUMN 6:
  Line 9, "has" should read -- having --.
  Line 34, "system," should read -- systems, --.

COLUMN 7:
  Line 11, "provide" should read -- provides --.
  Line 17, "method" should read -- method. --; "This appli-" should be deleted; and the right margin should be closed up.
  Line 18, "cation" should read -- This application --, and which should begin a new paragraph.

COLUMN 8:
  Line 19, "fanned" should read -- formed --.

Signed and Sealed this

Twentieth Day of March, 2007

JON W. DUDAS
*Director of the United States Patent and Trademark Office*